United States Patent
Ishida

(10) Patent No.: US 6,476,424 B1
(45) Date of Patent: Nov. 5, 2002

(54) SEMICONDUCTOR MEMORY DEVICE

(75) Inventor: Minoru Ishida, Tokyo (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 09/499,612

(22) Filed: Feb. 7, 2000

(30) Foreign Application Priority Data

Feb. 10, 1999 (JP) .......................................... 11-033418

(51) Int. Cl.$^7$ .......................... H01L 27/10; H01L 27/11
(52) U.S. Cl. ...................... 257/206; 257/208; 257/903
(58) Field of Search ............................... 257/204, 208, 257/206, 506, 903

(56) References Cited

U.S. PATENT DOCUMENTS

| | | | | | |
|---|---|---|---|---|---|
| 5,377,140 | A | * | 12/1994 | Usuki ........................ | 365/154 |
| 5,541,427 | A | * | 7/1996 | Chappell et al. ............ | 257/306 |
| 5,576,560 | A | * | 11/1996 | Runaldue et al. ........... | 257/208 |
| 5,706,226 | A | * | 1/1998 | Chan et al. ................. | 365/156 |
| 6,078,201 | A | * | 6/2000 | Crotty ........................ | 327/143 |

FOREIGN PATENT DOCUMENTS

JP              07130876         *  5/1995

* cited by examiner

*Primary Examiner*—Eddie Lee
*Assistant Examiner*—Paul E Brock, II
(74) *Attorney, Agent, or Firm*—Rader, Fishman, & Grauer PLLC; Ronald P. Kananen, Esq.

(57) ABSTRACT

A semiconductor memory device which can suppress the occurrence of corner rounding through the resist patterning process to achieve a reduction in cell size and higher integration. A relationship between a channel width DT.W of the drive transistor, a channel length DT.L of the drive transistor, a channel width WT.W of the word transistor and a channel length WT.L of the word transistor is given by: $(DT.W/WT.W)/(WT.L/DT.L)<1.2$. The channel width DT.W of the drive transistor is equal to the channel width WT.W of the word transistor, to reduce steps in the patterns of p-type active regions. The channel length WT.L of the word transistor is larger than the channel length DT.L of the drive transistor, that is, $(WT.L/DT.L)>1$.

4 Claims, 6 Drawing Sheets

SEMICONDUCTOR MEMORY DEVICE

BACKGROUND OF THE INVENTION

1. Field of the Invention

The present invention relates to a semiconductor memory device such as an SRAM (Static Random Access Memory) cell having six transistors.

2. Description of the Related Art

A SRAM cell generally has a latch and two transistors (word transistors). On-off operations of the transistors are controlled based on the voltage applied to a word line and thereby connection between each of two memory nodes of the latch and a bit line is made or broken. SRAM cells can be broadly divided into two types, namely, a MOS transistor load type and a high resistance load type, based on a difference in a load element of the latch. SRAM cells of the MOS transistor load type, configured with six transistors, fall into two known types: a P-channel MOS transistor (called pMOS in the followings) load type and a TFT (Thin Film Transistor) load type, according to the type of its load transistor.

FIG. 6 shows an example of a configuration pattern of a SRAM cell of the pMOS load type according to the related art. In FIG. 6, a SRAM cell is shown provided with a gate of the transistor. Wire connection inside the cell or upper wiring layers such as bit lines are omitted.

The SRAM cell 100 of the pMOS load type has two p-type active regions 101a and 101b, and two n-type active regions 102a and 102b. In the p-type active regions 101a and 101b, an n-channel MOS transistor (called nMOS in the followings) as a drive transistor is formed. In the n-type active regions 102a and 102b, a p-channel MOS transistor (called pMOS in the followings) as a load transistor is formed. The p-type active regions 101a and 101b, and the n-type active regions 102a and 102b are surrounded by an element separation insulating region 103 of LOCOS (Local Oxidation of Silicon) or trench construction, for example.

In the SRAM cell 100 of the related art, the two p-type active regions 101a and 101b are provided in a parallel arrangement, one above the other as seen in the figure. Each of the p-type active regions 101a and 101b has a step 106. In the p-type active region 101a, a drive transistor Qn1 and a word transistor Qn3 are formed on opposite sides of the step 106 to sandwich the step 106. In the p-type active region 101b, a drive transistor Qn2 and a word transistor Qn4 are formed on opposite sides of the step 106 to sandwich the step 106. A word line (WL$_1$) 194a, which also works as a gate electrode of the word transistor Qn3, is provided orthogonal to the p-type active region 101a. A word line (WL$_2$) 104b, which also works as a gate electrode of the word transistor Qn4, is provided orthogonal to the p-type active region 101b. On the other hand, a common gate line 105a (GL1), which also works as a gate electrode of the drive transistor Qn1, is provided in the vertical direction viewing FIG. 6 and orthogonal to the p-type active region 101a. A common gate line 105b (GL2) is provided in the same direction and orthogonal to the p-type active region 101b. The common gate lines 105a and 105b, and the word lines 104a and 104b are all made of a first polysilicon layer containing impurities.

The common gate line 105a is also orthogonal to the n-type active region 102a. The common gate line 105b is also orthogonal to the n-type active region 102b. Thereby, pMOS (load transistors Qp1 and Qp2) are formed in the n-type active regions 102a and 102b. The load transistor Qp1 and the drive transistor Qn1 constitute a first inverter. The load transistor Qp2 and the drive transistor Qn2 constitute a second inverter. The first inverter and the second inverter constitute a latch. The common gate line 105a is in line with the word line 104b. The common gate line 105b is in line with the word line 104a. Each of the p-type active regions 101a and 101b is electrically connected to a bit line (not shown) or a Vss (common potential) supply line (not shown) via a contact 107. Each of the n-type active regions 102a and 102b is commonly connected to a Vcc (source voltage) supply line via a contact (not shown).

In the SRAM cell with the above-described six-transistor configuration of the related art, the relationship between the word transistors and the drive transistors is given by DT.L=WT.L, where DT.L denotes a channel length of the drive transistors Qn1 and Qn2, and WT.L denotes a channel length of the word transistors Qn3 and Qn4; to be specific, DT.L=WT.L=0.18 µm, as will be shown in Table 1 later. In addition, denote a channel width of the drive transistors Qn1 and Qn2 by DT.W. Denote a channel width of the word transistors Qn3 and Qn4 by WT.W. Then, DT.W equals to 0.64 µm while WT.W equals to 0.49 µm. A channel width as used herein refers to the length of a transistor measured vertical to the direction of channel current flows.

According to the general practice in such a SRAM cell, the drive transistors Qn1 and Qn2 have the same dimensions (i.e., channel length and channel width) as the word transistors Qn3 and Qn4; that is, DT.W/WT.W=DT.L/WT.L=1.0.

However, this is not the case in a cell design intended for ensuring stability of cell operation such as static noise margin (hereinafter referred to as SNM). In such a cell design, the channel width DT.W of the drive transistors Qn1 and Qn2 is larger than the channel width WT.W of the word transistors Qn3 and Qn4. In other words, a cell is designed so that the word transistors Qn3 and Qn4 have relatively larger resistance to channel current compared to the drive transistors Qn1 and Qn2, thereby pull down current decreases. For this purpose, as shown in FIG. 6, in the SRAM cell 100 of the related art as described above, the patterns of the p-type active regions 101a and 101b have steps 106 to cause a difference between the channel width of the drive transistors Qn1 and Qn2, and the channel width of the word transistors Qn3 and Qn4. The height of the steps 106, that is, a difference between DT.W and WT.W (DT.W−WT.W), equals to 0.15 µm.

On the other hand, to achieve higher integration, the selfalign contact technique is introduced in such a SRAM cell, or alternatively, the pattern of the contact is formed in accurate alignment with respect to a first polysilicon base layer (i.e., the word lines 104a and 104b, and the common gate lines 105a and 105b). This reduces space between the polysilicon layer and the contact 107 to scale down a cell.

In general, however, the corners of the steps 106 of the patterns of the p-type active regions 101a and 101b are rounded (corner rounding) through the resist patterning process; forming the patterns to precise design dimensions is impossible. If space between the polysilicon layer and the contact 107 is reduced as described above, the distance between the drive transistor Qn1 or Qn2, and the word transistor Qn3 or Qn4 decreases. This causes a decrease in the distance between the steps 106 and the drive transistor Qn1, the drive transistor Qn2, the word transistor Qn3 or the word transistor Qn4. The steps 106 are provided between the drive transistor Qn1 and the word transistor Qn3, and between the drive transistor Qn2 and the word transistor Qn4. In other words, the drive transistors Qn1 and Qn2, and the word transistors Qn3 and Qn4 are formed in or in the neighborhood of the areas with occurrences of corner rounding (corner rounding areas 106a) as shown by the dash-double dot lines in FIG. 6. This causes a problem that the drive transistors and the word transistors of the SRAM cell of the related art cannot be formed with an exact channel width to design dimensions.

For this reason, in the SRAM cell of the related art, even if space between the polysilicon layer and the contact is reduced by introducing the selfalign contact technique or by forming the pattern of the contact in more accurate alignment with respect to the polysilicon base layer, it is necessary to increase space between the drive transistor and the word transistor to the extent that would prevent the influence of the corner rounding areas. This limits a scale down of a cell.

The present invention is made in view of such a problem. An object of the invention is to provide a semiconductor memory device making it possible to suppress the occurrence of corner rounding, to reduce the size of cells and to achieve higher integration.

A semiconductor memory device according to the present invention comprises a drive transistor and a word transistor, wherein the relationship between a channel width DT.W of the drive transistor, a channel length DT.L of the drive transistor, a channel width WT.W of the word transistor and a channel length WT.L of the word transistor is given by:

$$(DT.W/WT.W)/(WT.L/DT.L)<1.2$$

A channel width as used herein refers to a length of a transistor measured vertical to the direction in which channel current flows.

In the semiconductor memory device according to the present invention, the relationship between a channel width DT.W of the drive transistor, a channel length DT.L of the drive transistor, a channel width WT.W of the word transistor and a channel length WT.L of the word transistor is given as stated above. Making DT.W/WT.W closer to 1.0 while making WT.L/DT.L larger than 1.0, that is, making a channel length WT.L of the word transistor larger than a channel length DT.L of the drive transistor, reduces or eliminates the steps of the patterns in active regions. This suppresses the occurrence of corner rounding through the resist patterning process.

Other and further objects, features and advantages of the invention will appear more fully from the following description.

DETAILED DESCRIPTION OF THE PREFERRED EMBODIMENTS

Embodiments of the present invention will be described below in detail with reference to the accompanying drawings.

Figure 4:
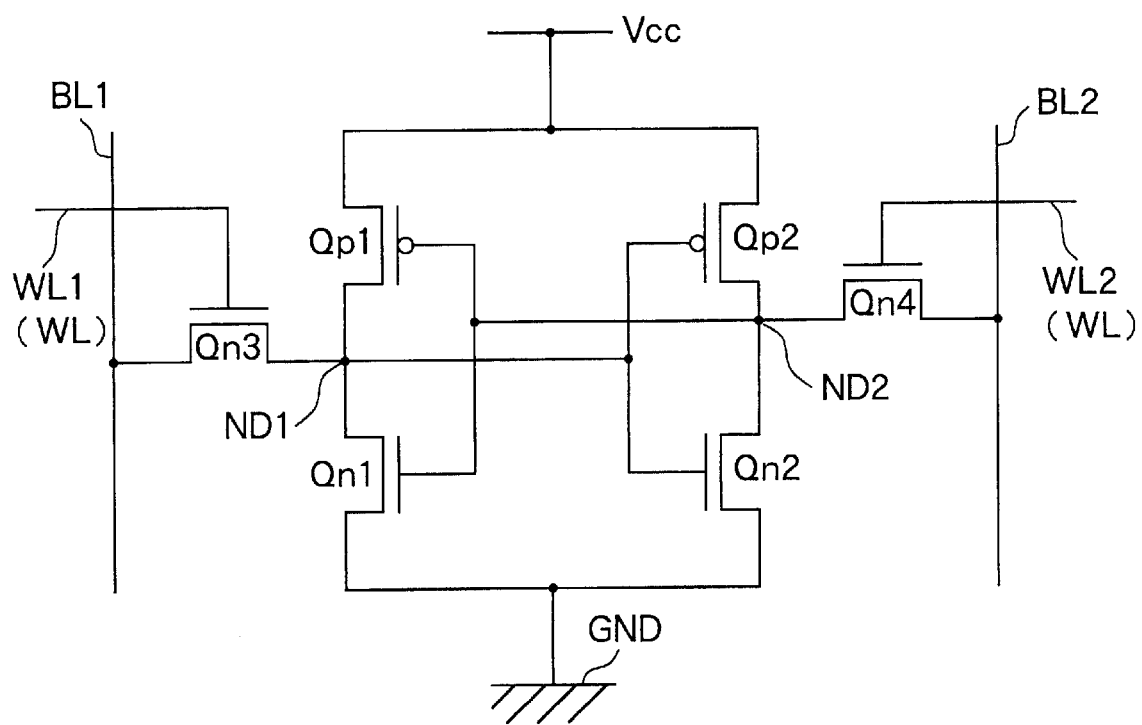
FIG. 4 is a circuit diagram of a SRAM cell of the PMOS load type.

First, a circuit configuration of a SRAM cell of the pMOS load type will be described with reference to FIG. 4, before giving description of specific embodiments.

The SRAM cell of the pMOS load type, having a six-transistor configuration, includes n-channel MOS transistors (called nMOS in the followings) Qn1 and Qn2, p-channel MOS transistors (called pMOS in the followings) Qp1 and Qp2. The NMOS Qn1 and Qn2 work as drive transistors, while the PMOS Qp1 and Qp2 work as load transistors. The pMOS Qp1 and Qp2 as load transistors, and the nMOS Qn1 and Qn2 as drive transistors form two inverters (latch). Input terminals of the inverters are crossed over each other; an input terminal of one inverter is connected to an output terminal of another inverter, while an input terminal of the latter inverter is connected to an output terminal of the former inverter.

The NMOS Qn3 and Qn4 are word transistors for controlling the connection of connecting points (memory nodes ND1 and ND2) of each inverter to bit lines BL1 and BL2 based on the voltage applied to word lines $WL_1$ and $WL_2$. This cell configuration is common, and more detailed description of the connection is omitted.

In the SRAM cell of the pMOS load type, one bit line BL1 is maintained at a high potential while a predetermined voltage is applied to the gate of the word transistors Qn3 and Qn4 through word lines WL1 and WL2. Thereby, both transistors Qn3 and Qn4 are turned to ON to accumulate charge in the memory nodes ND1 and ND2. The drive transistors Qn1 and Qn2, and the load transistors Qp1 and Qp2 operate such that, when one memory node is "H (high)," another memory node is "L (low)," as a characteristic of a latch configuration. For example, when the memory node ND1 is "H" and the memory node ND2 is "L," the drive transistor Qn2 and the load transistor Qp1 are turned to ON and the drive transistor Qn1 and the load transistor Qp2 are turned to OFF. As a result, the memory node ND1 receives charge from a supply line of a source voltage Vcc, and the memory node ND2 is continuously kept at the grounded potential. Conversely, if the memory node ND1 is forced to "L" by turning the word transistor Qn3 to ON when the bit line BL1 potential is "L," or if the memory node ND2 is forced to "H" by turning the word transistor Qn4 to ON when the bit line BL2 potential is "H," the drive transistors Qn1 and Qn2, and the load transistors Qp1 and Qp2 are all inverted, and the memory node ND2 receives charge from the supply line of the source voltage Vcc to keep the memory node ND1 at the grounded potential. In this way, maintaining charge by the latch keeps charge in the memory nodes ND1 and ND2 statically. The potential of "L" or "H" is made to correspond to data of "0" or "1," respectively, so that the data can be stored in six transistors within the cell.

Figure 1:
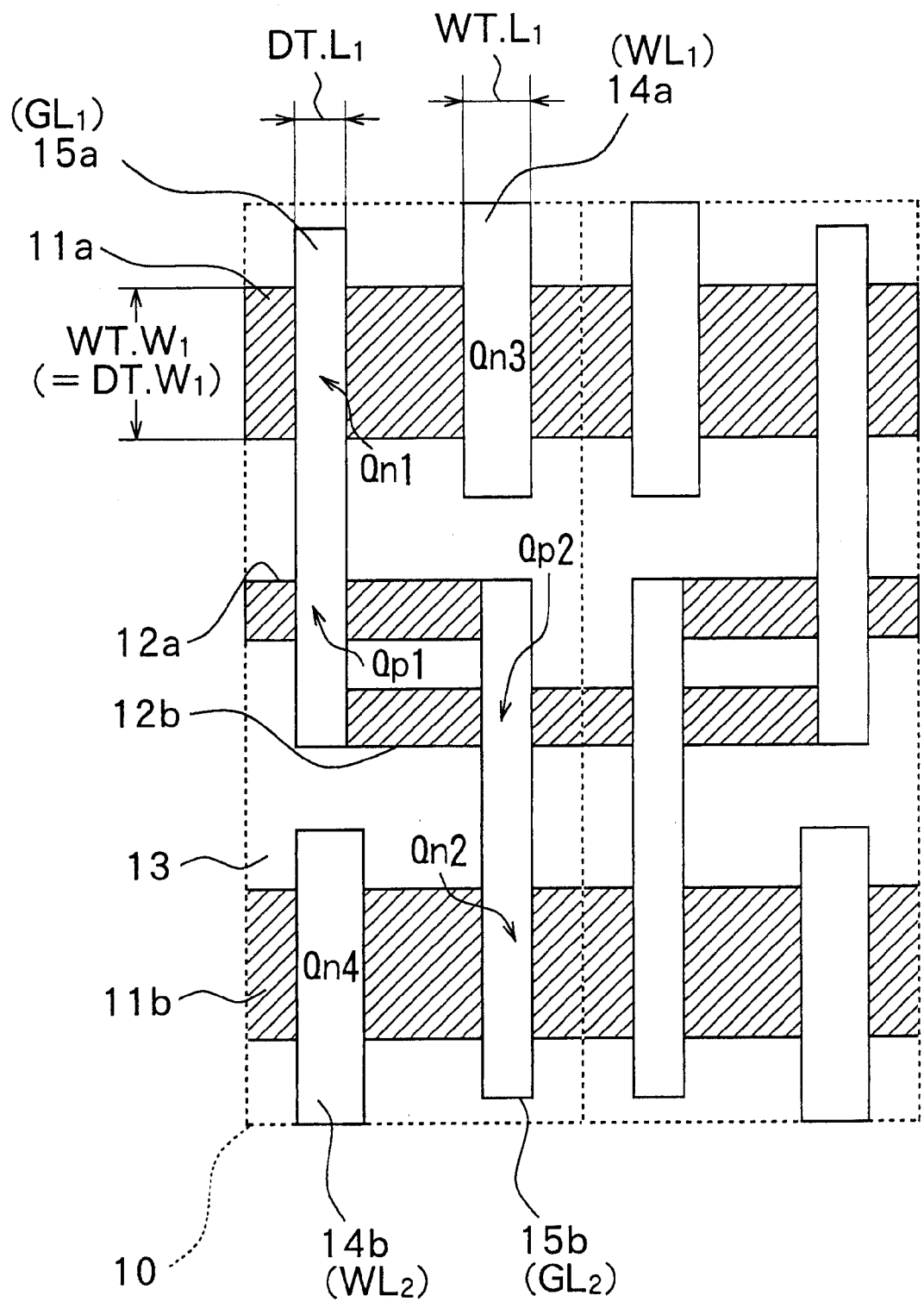
FIG. 1 is a plan view for explaining a pattern layout of a SRAM cell according to a first embodiment of the invention.

First Embodiment (FIG. 1 Table 1, Line d)

Next, the pattern layout of a SRAM cell having six transistors according to a first embodiment of the invention will be described with reference to FIG. 1. The SRAM cell 10 includes p-type active regions 11a and 11b as a first conductive type active region, and n-type active regions 12a and 12b as a second conductive type active region. The p-type active regions 11a and 11b, and the n-type active regions 12a and 12b are surrounded by an element separation insulating region 13 of LOCOS or of trench construction, for example.

In the SRAM cell 10, the p-type active region 11a and 11b are provided in a parallel arrangement, one above the other as seen in the figure. In the p-type active region 11a, a drive transistor Qn1 and a word transistor Qn3 are formed on opposite sides thereof. In the p-type active region 11b, a drive transistor Qn2 and a word transistor Qn4 are formed on $DT.W_1 = WT.W_1 = 0.49$ μm, $WT.L_1 = 0.23$ μm, $DT.L_1 = 0.18$ μm

TABLE 1

|  | DT.W (μm) | WT.W (μm) | DT.W / WT.W | WT.L (μm) | DT.L (μm) | WT.L / DT.L | (DT.W / WT.W) / (WT.L / DT.L) | DT.W − WT.W (μm) |
|---|---|---|---|---|---|---|---|---|
| Related Art |  |  |  |  |  |  |  |  |
| (a) | 0.64 | 0.49 | 1.3 | 0.18 | 0.18 | 1 | 1.3 | 0.15 |
| Present Invention |  |  |  |  |  |  |  |  |
| (b) | 0.59 | 0.49 | 1.2 | 0.19 | 0.18 | 1.06 | 1.13 | 0.1 |
| (c) | 0.54 | 0.49 | 1.1 | 0.21 | 0.18 | 1.18 | 0.93 | 0.05 |
| (d) | 0.49 | 0.49 | 1 | 0.23 | 0.18 | 1.3 | 0.77 | 0 | opposite sides thereof. A word line (WL$_1$) 14a, which works as a gate electrode of the word transistor Qn3, is provided orthogonal to the p-type active region 11a. A word line (WL$_2$) 14b, which works as a gate electrode of the word transistor Qn4, is provided common gate line 15a (GL1), which also serves as a gate electrode of the drive transistor Qn1, is provided in the vertical direction viewing FIG. 1 and orthogonal to the p-type active region 11a. A common gate line 15b (GL2) is provided in the same direction and orthogonal to the p-type active region 11b.

The common gate line 15a is also orthogonal to the n-type active region 12a. The common gate line 15b is also orthogonal to the n-type active region 12b. Thereby, pMOS (load transistors Qp1 and Qp2) are formed in the n-type active regions 12a and 12b. The load transistor Qp1 and the drive transistor Qn1 constitute a first inverter. The load transistor Qp2 and the drive transistor Qn2 constitute a second inverter. The first inverter and the second inverter form a latch. The common gate line 15a is in line with the word line 14b. The common gate line 15b is in line with the word line 14a. The common gate lines 15a and 15b, and the word lines 14a and 14b are all made of a first polysilicon layer containing impurities.

Figure 6:
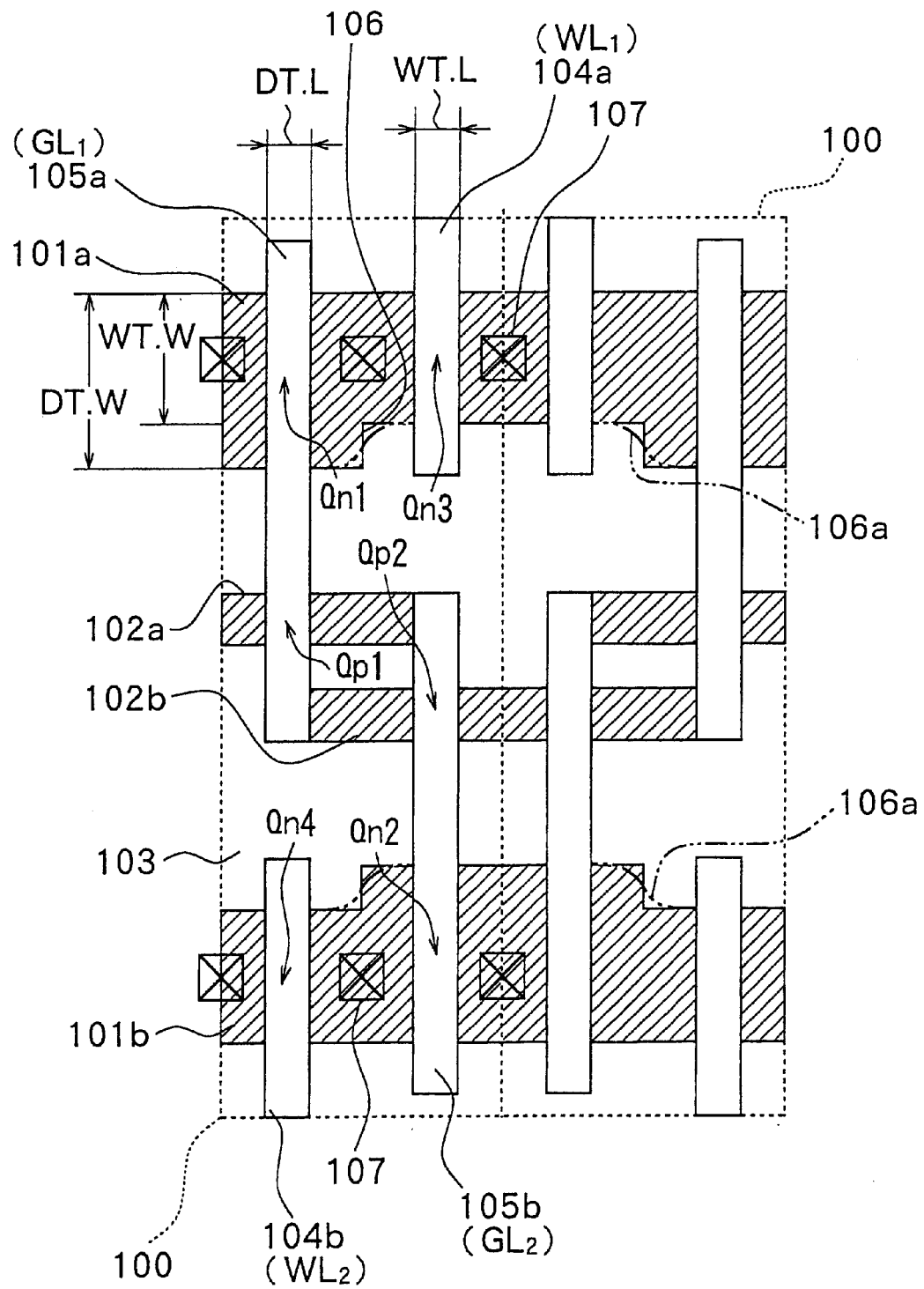
FIG. 6 is a diagram for explaining a pattern layout of a SRAM cell according to the related art.

The basic configuration of the SRAM cell 10 as described above is substantially the same as that of the SRAM cell 100 (FIG. 6) of the related art, except that the steps in the patterns of the p-type active regions 11a and 11b are eliminated by establishing the following relationship:

$$(DT.W_1/WT.W_1)/(WT.L_1/DT.L_1) = 0.77 \qquad (1)$$

wherein $DT.W_1$ denotes a channel width of the drive transistors Qn1 and Qn2, $DT.L_1$ denotes a channel length of the drive transistors Qn1 and Qn2, $WT.W_1$ denotes a channel width of the word transistors Qn3 and Qn4, and $WT.L_1$ denotes a channel length of the word transistors Qn3 and Qn4.

According to the embodiment, the channel width $DT.W_1$ of the drive transistors is equal to the channel width $WT.W_1$ of the word transistors ($DT.W_1 = WT.W_1$), while the channel length $WT.L_1$ of the word transistors is larger than the channel length $DT.L_1$ of the drive transistors ($WT.L_1/DT.L_1 > 1$). As seen from (d) in Table 1 below, a specific example of the combination of the dimensions of each transistor is as follows:

In the embodiment, the channel width $DT.W_1$ of the drive transistors Qn1 and Qn2 is equal to the channel width $WT.W_1$ of the word transistors Qn3 and Qn4. This eliminates the steps in the patterns of the p-type active regions 11a and 11b. On the other hand, the channel length $WT.L_1$ of the word transistors Qn3 and Qn4 is larger than the channel length $DT.L_1$ of the drive transistors Qn1 and Qn2. By making the channel length $WT.L_1$ of the word transistors Qn3 and Qn4 larger than the channel length $DT.L_1$ of the drive transistors Qn1 and Qn2, the word transistors Qn3 and Qn4 have relatively larger resistance to channel current compared to the drive transistors Qn1 and Qn2, thereby attaining stability of cell operations such as SNM. Since the p-type active regions 11a and 11b has no steps, the p-type active regions 11a and 11b are formed without the occurrence of corner rounding between the drive transistor Qn1 or Qn2 and the word transistor Qn3 or Qn4 as has been conventional, through the resist patterning process.

If space between the polysilicon layer and the contact is reduced, as described above, by introducing the selfalign contact technique or by forming the pattern of the contact in more accurate alignment with respect to the polysilicon base layer, the space can be minimized without taking the influence of corner rounding into consideration. In the embodiment, the area of a cell can be reduced to achieve higher integration, while attaining SNM equivalent to the SRAM cell of the related art.

In the embodiment, the channel width $DT.W_1$ of the drive transistors Qn1 and Qn2 is made equal to the channel width $WT.W_1$ of the word transistors Qn3 and Qn4, thereby the p-type active regions 11a and 11b have no steps. The present invention, however, can be applied to the case where $DT.W_1$ is unequal to $WT.W_1$ to form a step of a certain size so long as the influence of corner rounding can be substantially negligible. In general, the relationship between a channel width DT.W of the drive transistor, a channel length DT.L of the drive transistor, a channel width WT.W of the word transistor and a channel length WT.L of the word transistor is given by:

$$(DT.W/WT.W)/(WT.L/DT.L) < 1.2 \qquad (2)$$

Obviously, in this case, the channel length WT.L of the word transistors is made larger than the channel length DT.L of the drive transistors (WT.L/DT.L>1) as in the embodiment.

Preferably, the relationship above is given by:

$$(DT.W/WT.W)/(WT.L/DT.L)<1.1 \quad (3)$$

More preferably:

$$(DT.W/WT.W)/(WT.L/DT.L)<1.0 \quad (4)$$

Even more preferably:

$$(DT.W/WT.W)/(WT.L/DT.L)<0.9 \quad (5)$$

Figure 5:
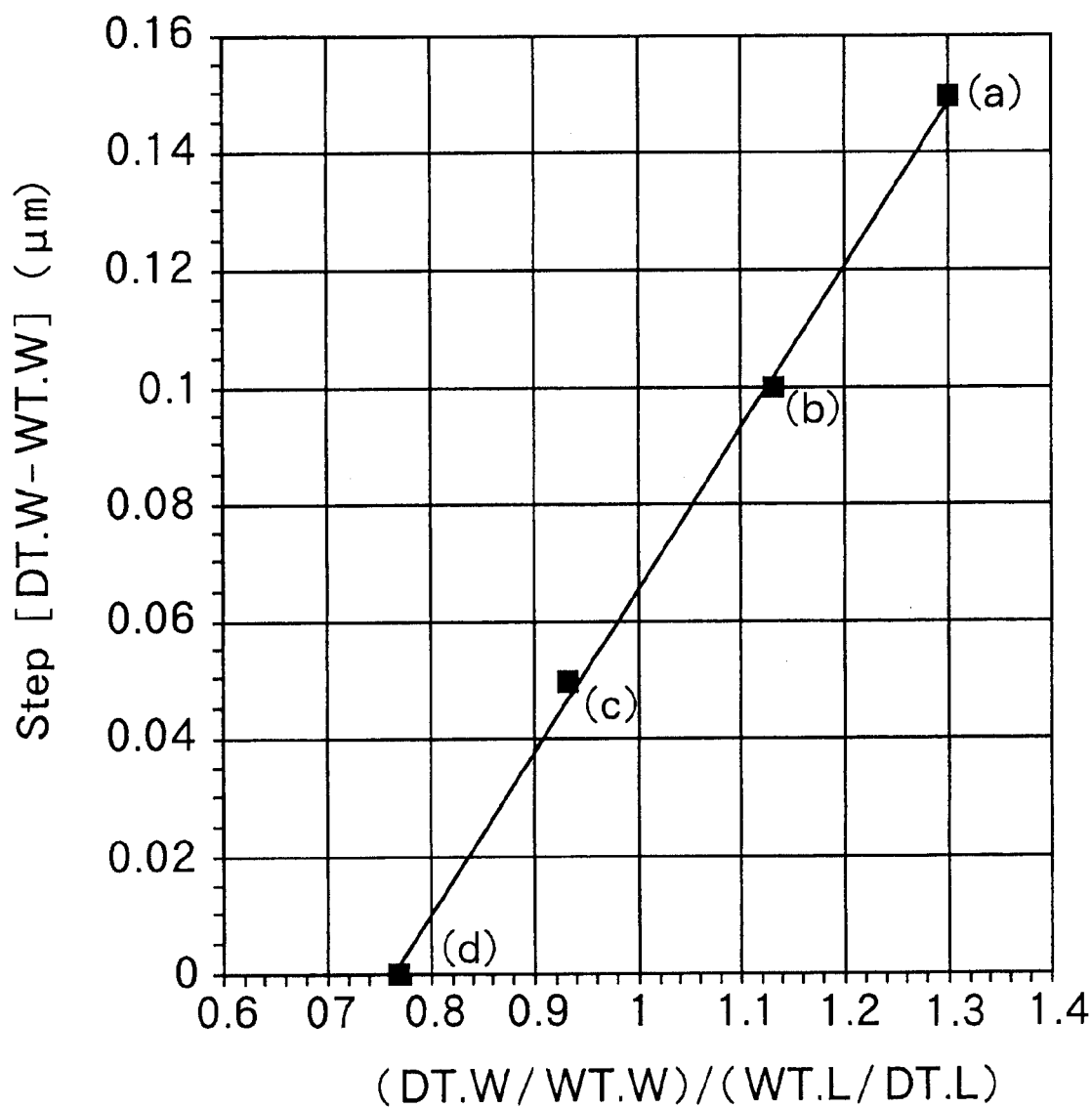
FIG. 5 is a characteristic diagram showing the relationship between (DT.W/LT.W)/(WT.L/DT.L) and a step [DT.W-WT.W].

FIG. 5 shows the relationship between the above-described size ratio (DT.W/WT.W)/(WT.L/DT.L) and the step [DT.W−WT.W]. As clearly seen in the figure, as the size ratio (DT.W/WT.W)/(WT.L/DT.L) gets smaller, the step [DT.W−WT.W] gets smaller, and the influence of corner rounding decreases. As shown in (b) to (d) in Table 1, in order to decrease the step [DT.W−WT.W], that is, to make (DT.W/WT.W) closer to 1.0, it is preferable that the channel length WT.L of the word transistors be larger than the channel length DT.L of the drive transistors ((WT.L/DT.L) >1).

Description will now be made as to other specific examples of (DT.W/WT.W)/(WT.L/DT.L) as a second embodiment and a third embodiment. The embodiments described below are the substantially same in configuration as the SRAM cell 10 shown in FIG. 1, except for the relationship between the channel length of the drive transistor, the channel width of the drive transistor, the channel length of the word transistor and the channel width of the word transistor. Therefore, similar reference characters are used throughout the several figures to denote parts having substantially similar function to the first embodiment and the detailed description thereof is omitted.

Figure 2:
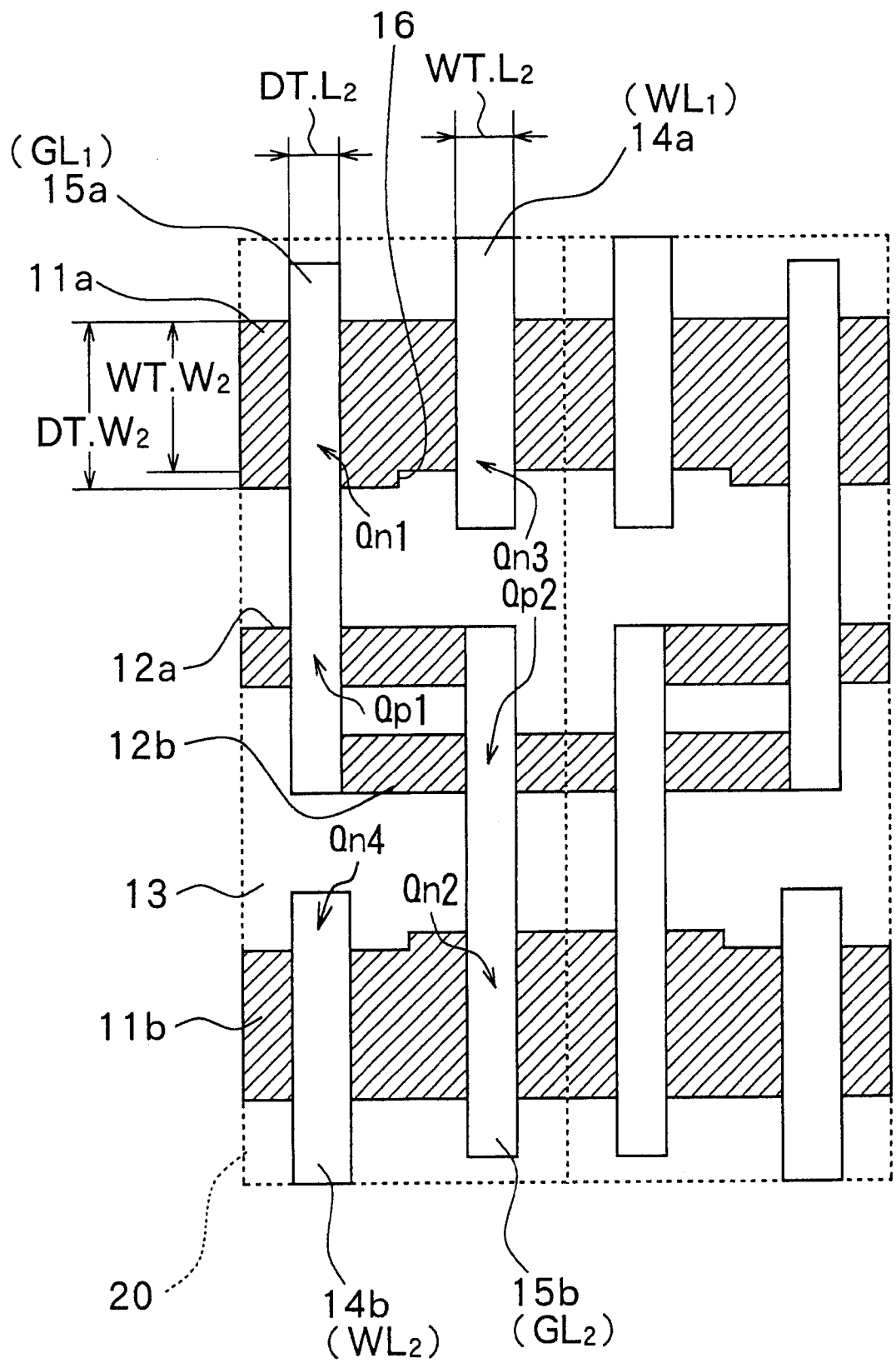
FIG. 2 is a plan view for explaining a pattern layout of a SRAM cell according to a second embodiment of the invention.

Second Embodiment (FIG. 2, Table 1, Line c)

In a SRAM cell 20 according to the embodiment, the relationship between a channel width $DT.W_2$ of the drive transistors Qn1 and Qn2, a channel length $DT.L_2$ of the drive transistors Qn1 and Qn2, a channel width $WT.W_2$ of the word transistors Qn3 and Qn4 and a channel length $WT.L_2$ of the word transistors Qn3 and Qn4 is given by:

$$(DT.W_2/WT.W_2)/(WT.L_2/DT.L_2)=0.93 \quad (6)$$

Specifically, as seen in (c) in Table 1, $DT.W_2$=0.54 μm, $WT.W_2$=0.49 μm, $WT.L_2$=0.21 μm, $DT.L_2$=0.18 μm. The patterns of the p-type active regions 11a and 11b have the steps 16 ($DT.W_2$−$WT.W_2$) of 0.05 μm, which are one third the size of the steps in the SRAM cell 100 of the related art. The channel length $WT.L_2$ of the word transistors Qn3 and Qn4 is larger than the channel length $DT.L_2$ of the drive transistors Qn1 and Qn2 (1.18 times the channel length $DT.L_2$ of the drive transistors Qn1 and Qn2).

Figure 3:
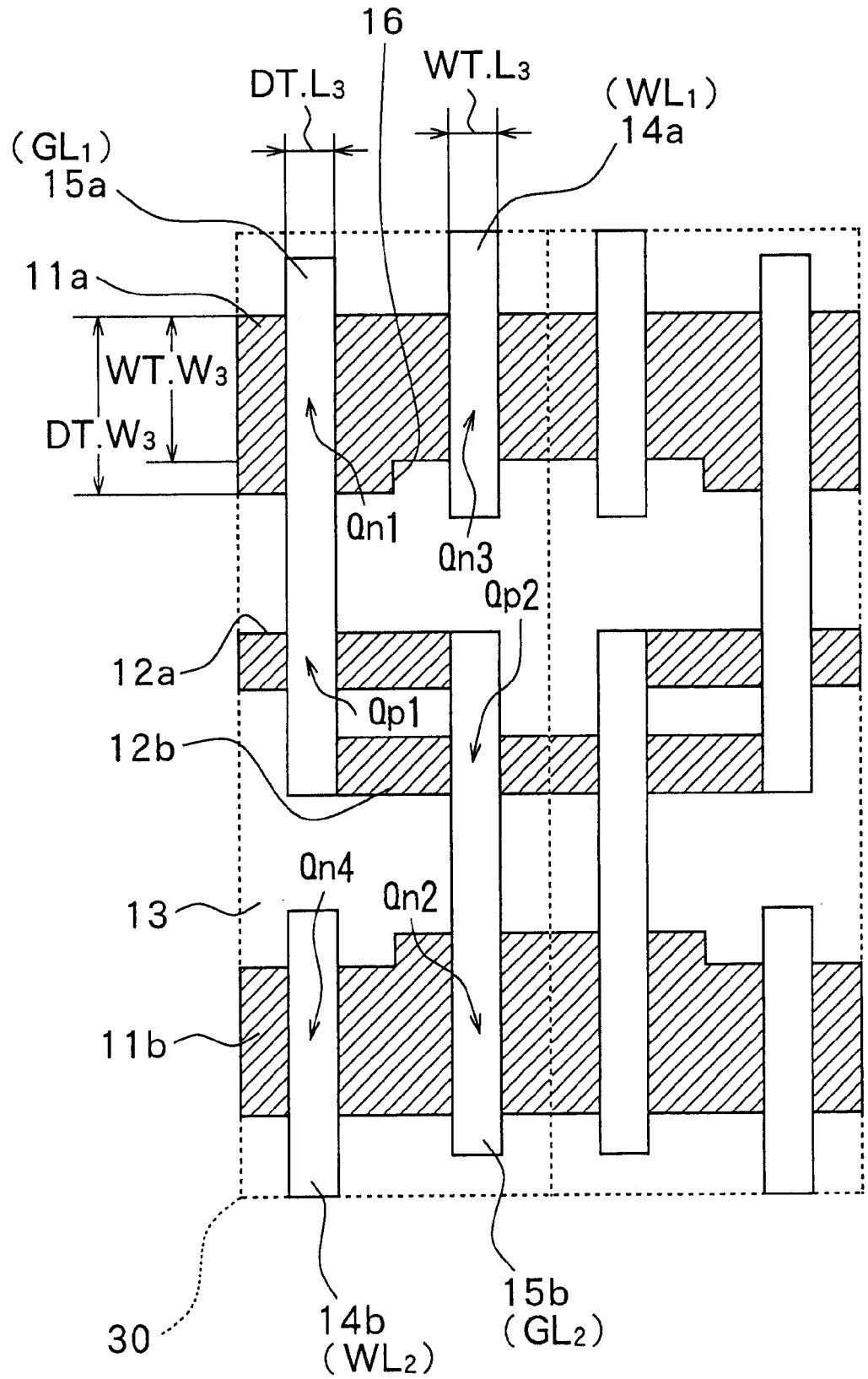
FIG. 3 is a plan view for explaining a pattern layout of a SRAM cell according to a third embodiment of the invention.

Third Embodiment (FIG. 3, Table 1, Line b)

In a SRAM cell 30 according to the embodiment, the relationship between a channel width $DT.W_3$ of the drive transistors Qn1 and Qn2, a channel length $DT.L_3$ of the drive transistors Qn1 and Qn2, a channel width $WT.W_3$ of the word transistors Qn3 and Qn4, and a channel length $WT.L_3$ of the word transistors Qn3 and Qn4 is given by:

$$(DT.W_3/WT.W_3)/(WT.L_3/DT.L_3)=1.13 \quad (7)$$

Specifically, as seen in (b) in Table 1, $DT.W_3$=0.59 μm, $WT.W_3$=0.49 μm, $WT.L_3$=0.19 μm, $DT.L_3$=0.18 μm. In the embodiment, the patterns of the p-type active regions 11a and 11b have the steps 16 ($DT.W_3$−$WT.W_3$) of 0.1 μm, which are two thirds the size of the steps in the SRAM cell 100 of the related art. The channel length $WT.L_3$ of the word transistors Qn3 and Qn4 is larger than the channel length $DT.L_3$ of the drive transistors Qn1 and Qn2 (1.06 times the channel length $DT.L_3$ of the drive transistors Qn1 and Qn2).

The effects of the SRAM cell 20 of the second embodiment and the SRAM cell 30 of the third embodiment are substantially the same as those of the SRAM cell 10 of the first embodiment. The use of the SRAM cells 20 and 30 suppresses the occurrence of corner rounding through the resist patterning process, thereby enabling reduction in cell size and higher integration, while attaining SNM equivalent to the SRAM cell of the related art.

As described above, according to the semiconductor memory device of the present invention, the relationship between a channel width DT.W of the drive transistor, a channel length DT.L of the drive transistor, a channel width WT.W of the word transistor and a channel length WT.L of the word transistor is given by:

$$(DT.W/WT.W)/(WT.L/DT.L)<1.2.$$

Thus, the occurence of corner rounding during the process of patterning resist can be effectively suppressed, thereby achieving a scale down of a cell and higher integration.

Obviously many modifications and variations of the present invention are possible in the light of the above teachings. It is therefore to be understood that within the scope of the appended claims the invention may be practiced otherwise than as specifically described.

What is claimed is:

1. A semiconductor memory device comprising a plurality of memory cells, each memory cell having a drive transistor, a word transistor and an active region of a conductive type, the drive transistor and the word transistor being provided next to each other in the active region, wherein a relationship between a channel width DT.W of the drive transistor, a channel length DT.L of the drive transistor, a channel width WT.W of the word transistor and a channel length WT.L of the word transistor is given by (DT.W/WT.W)/(WT.L/DT.L)=0.93 and wherein the channel width of the drive transistors is equal to the channel width of the word transistors while the channel length of the word transistor is larger than the channel length of the drive transistors.

2. A semiconductor memory device comprising a plurality of memory cells, each memory cell having a drive transistor, a word transistor and an active region of a conductive type, the drive transistor and the word transistor being provided next to each other in the active region, wherein a relationship between a channel width DT.W of the drive transistor, a channel length DT.L of the drive transistor, a channel width WT.W of the word transistor and a channel length WT.L of the word transistor is given by (DT.W/WT.W)/(WT.L/DT.L) <1.0.

3. A semiconductor memory device comprising a plurality of memory cells, each memory cell having a drive transistor, a word transistor and an active region of a conductive type, the drive transistor and the word transistor being provided next to each other in the active region, wherein a relationship between a channel width DT.W of the drive transistor, a channel length DT.L of the drive transistor, a channel width WT.W of the word transistor and a channel length WT.L of the word transistor is given by (DT.W/WT.W)/(WT.L/DT.L) <0.9.

4. A semiconductor memory device comprising at least a pair of memory cells, each memory cell having a drive transistor (Qn1, Qn2), a word transistor (Qn3, Qn4), an active region of a conductive type, the drive transistor and the word transistor of each pair being provided next to each other in the respective active regions, and a load transistor forming a pair of inverters wherein an input terminal of one inverter is connected to an output of another inverter, while an input terminal of the another inverter is connected to an output terminal of the one inverter, wherein a relationship between a channel width DT.W of the drive transistor, a channel length DT.L of the drive transistor, a channel width WT.W of the word transistor and a channel length WT.L of the word transistor is given by $(DT.W/WT.W)/(WT.L/DT.L)=0.77$ and wherein the channel width of the drive transistor is equal to the channel width of the word transistor while the channel length of the word transistor is larger than the channel length of the drive transistors.

* * * * *